United States Patent
Kira et al.

(10) Patent No.: US 6,177,730 B1
(45) Date of Patent: Jan. 23, 2001

(54) SEMICONDUCTOR BARE CHIP, METHOD OF MANUFACTURING SEMICONDUCTOR BARE CHIP AND MOUNTING STRUCTURE OF SEMICONDUCTOR BARE CHIP

(75) Inventors: Hidehiko Kira; Kiyoshi Fukui; Kazuhisa Tsunoi; Shunji Baba, all of Kawasaki (JP)

(73) Assignee: Fujitsu Limited, Kawasaki (JP)

(*) Notice: Under 35 U.S.C. 154(b), the term of this patent shall be extended for 0 days.

(21) Appl. No.: 09/021,407

(22) Filed: Feb. 10, 1998

(30) Foreign Application Priority Data

Sep. 10, 1997 (JP) .................................... 9-245496

(51) Int. Cl.[7] ...................................... H01L 2/48
(52) U.S. Cl. ................. 257/778; 257/734; 257/774; 257/780; 257/737
(58) Field of Search ..................... 257/778, 737, 257/780, 738, 774

(56) References Cited

U.S. PATENT DOCUMENTS 5,633,204  5/1997  Tago et al. ............................ 438/614

FOREIGN PATENT DOCUMENTS

| 0 753 890 A2 | 1/1997 | (EP) . |
| 0 753 890 A3 | 1/1997 | (EP) . |
| 0 758 145 A2 | 2/1997 | (EP) . |
| 0 758 145 A3 | 2/1997 | (EP) . |
| 3-188635 | 8/1991 | (JP) . |
| 4-180232 | 6/1992 | (JP) . |
| 7-142488 | 6/1995 | (JP) . |
| 7-176534 | 7/1995 | (JP) . |
| 7-193101 | 7/1995 | (JP) . |
| 8-213398 | 8/1996 | (JP) . |
| WO97/27492 | 7/1997 | (WO) . |

*Primary Examiner*—Matthew Smith
*Assistant Examiner*—Renzo Rocchegiani
(74) *Attorney, Agent, or Firm*—Armstrong, Westerman, Hattori, McLeland & Naughton

(57) ABSTRACT

A semiconductor bare chip includes a plurality of stud bumps provided on the surface of the semiconductor bare chip body, each of the stud bumps including a seat and a head protruding from the seat. A height of the head is less than a thickness of electrodes on said board.

3 Claims, 7 Drawing Sheets

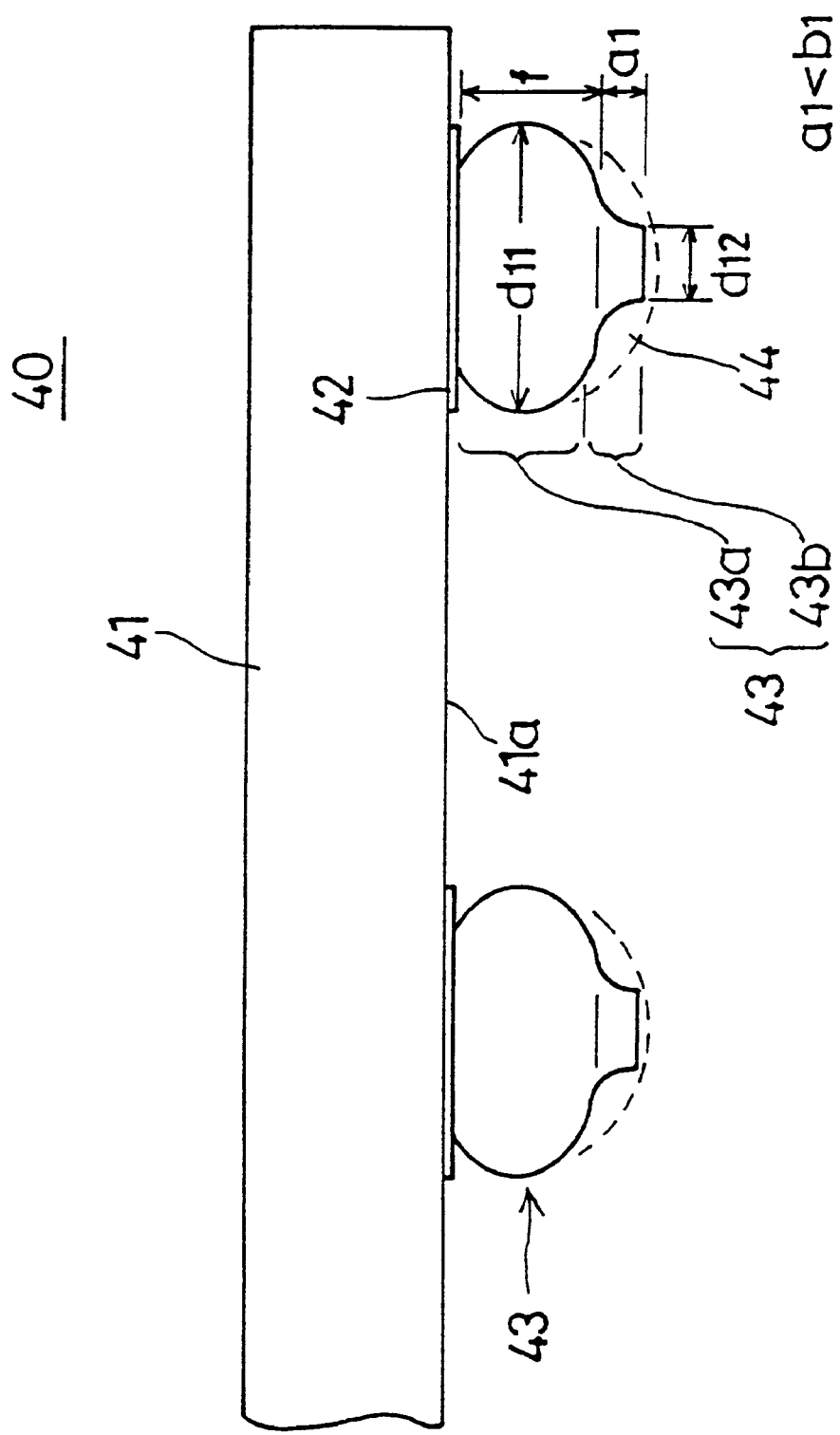

SEMICONDUCTOR BARE CHIP, METHOD OF MANUFACTURING SEMICONDUCTOR BARE CHIP AND MOUNTING STRUCTURE OF SEMICONDUCTOR BARE CHIP

BACKGROUND OF THE INVENTION

1. Field of the Invention

The present invention generally relates to a semiconductor bare chip and a method of manufacturing the semiconductor bare chip and particularly relates to a mounting structure of the semiconductor bare chip, which allows reduced mounting area.

2. Description of the Related Art

Because of the recent miniaturization of portable electronic devices, there is a need for a higher density when mounting a semiconductor on a mounting board. In order to achieve high-density mounting, a technology has been developed which utilizes the flip-chip method. With the flip-chip method, a semiconductor bare chip, which is a chip that is not packaged, is directly mounted on the mounting board. Thus, a reduced mounting area is achieved, since no additional area is necessary around the semiconductor bare chip.

FIG. 1 shows a partially enlarged view of a semiconductor bare chip 10 of the related art. FIGS. 2A–2B are diagrams showing the semiconductor bare chip 10 of the related art which is mounted on a printed board 20.

As shown in FIG. 1, the semiconductor bare chip is constructed such that a stud bump 13 made of Au (gold) is formed on each electrode 12 on a bottom surface 11a of a semiconductor bare chip body 11 which has been cut-out from a wafer. The semiconductor bare chip is also constructed such that a conductive adhesive agent 14 is provided so as to cover the head of the stud bump 13.

The stud bump includes a seat 13a and a head 13b. The seat 13a has a shape of a squeezed sphere. The head 13b is substantially cylindrical. The head 13b has a diameter d2, which is smaller than a diameter d1 of the seat 13a. The head 13b protrudes from the seat 13a by a length a. The head 13b is formed so that a predetermined amount of conductive adhesive agent 14 will be provided thereon, and that the stud bump 13 can be easily pressed against an electrode 21 on a printed board 20.

As shown in FIG. 2A, the electrodes 21 are formed on the printed board 20. The electrodes 21 have a thickness b. The electrodes 21 have a rectangular shape with a side length c of approximately 40 μm. Thus stud bumps 13 and the electrodes 21 are positioned so as to correspond to each other.

As shown in FIG. 2A, the semiconductor bare chip 10 is mounted using a flip-chip method of the press joint type. That is, the head 13b of the stud bump 13 is pressed against the electrode 21 and is stuck on the electrode 21 using the conductive adhesive agent 14. Also, the semiconductor bare chip body 11 is stuck on the printed board 20 by a thermosetting adhesive agent 31. Since the thermosetting adhesive agent 31 is provided within a gap 30 between the semiconductor bare chip body 11 and the printed board 20 and has been thermoset, the entire bottom surface 11a of the semiconductor bare chip body 11 is stuck on the printed board 20. Also, because the thermosetting adhesive agent 31 is thermoset and contracted, the entire bottom surface 11a of the semiconductor bare chip body 11 is pulled towards the printed board 20 with a force F1. With this force F1, the head 13b of the stud bump 13 is pressed against the electrode 21.

Here, the head 13b is formed such that a height a is approximately 30 μm so that a sufficient amount of the conductive adhesive agent 14 adheres thereto.

The thickness b of the electrode 21 on the printed board 20 is reduced along with the refinement of the patterning, and is approximately 20 μm.

The relationship between the height a of the head and the thickness b of the electrode 21 can be expressed as a>b.

If the semiconductor bare chip 10 is displaced from the predetermined position when mounting the semiconductor bare chip 10 by the flip-chip method, the head 13b will slip off from the electrode 21 as shown in FIG. 2B. That is, the head 13b touches the top surface of the printed board 20 and the shoulder of the seat 13a does not come in contact with the electrode 21. Because of this, there will be no electrical connection between the stud bump 13 and the electrode 21.

In the following, a size which allows the semiconductor bare chip 10 to be displaced from a predetermined position P in either one of the directions X1 and X2 is referred to as an allowable size e. When mounting the semiconductor bare chip 10 by the flip-chip method, the allowable size e is determined such that the head 13b touches an edge of the electrode 21. The allowable size e is generally (c/2)+(d2/2), and is as small as approximately 30 μm. This requires higher accuracy of a positioning process when mounting the semiconductor bare chip 10 by the flip-chip method. This makes it difficult to mount the semiconductor bare chip 10. Therefore, a problem arises that the possibility of poor mounting may occur and that of mounting production may be reduced.

SUMMARY OF THE INVENTION

Accordingly, it is a general object of the present invention to provide a semiconductor bare chip, a method of manufacturing a semiconductor bare chip and a mounting structure of a semiconductor bare chip which can solve the problems described above.

It is another and more specific object of the invention to provide a semiconductor bare chip which can achieve an improved yield of production in the mounting process.

In order to achieve the above objects according to the present invention, a semiconductor bare chip includes a plurality of stud bumps provided on the surface of the semiconductor bare chip body, each of the stud bumps including a seat and a head protruding from the seat, wherein a height of the head is less than a thickness of electrodes provided on a board on which the semiconductor bare chip is mounted.

In the semiconductor bare chip described above, the height of the head of the stud bump is determined so as to be smaller than the thickness of the electrode on the board on which the semiconductor bare chip is mounted. When mounting the semiconductor bare chip with each stud bump connected to a corresponding electrode on the board, the semiconductor bare chip may be displaced from its predetermined position. This results in the head slipping off from the electrode. Even in such a case, the shoulder of the seat touches the electrode, enabling the connection at the seat. Therefore, an allowable amount of displacement of the semiconductor bare chip from the predetermined position can be increased compared to the related art. Thereby, an improved yield of production in mounting process is achieved.

It is still another object of the present invention to provide a method of manufacturing a semiconductor bare chip which can achieve an accurate determination of the thickness of the head of each stud bump.

In order to achieve the above object according to the present invention, a method of manufacturing a semiconductor bare chip which comprises a semiconductor bare chip body and a plurality of stud bumps provided on a surface of said semiconductor bare chip body, each of said stud bumps comprising a seat and a head protruding from said seat, said method comprising the steps of:

a) pressing the semiconductor bare chip against a plate so as to cause a deformation of an end portion of said head; and b) making an adjustment to a height of said head so that said height of said head is less than a thickness of electrodes provided on a board, said semiconductor bare chip being mounted on said board, said adjustment being achieved by controlling a force exerted by the pressing of step a).

In the method described above, the stud bumps are provided on the surface of the semiconductor bare chip body by wire bonding. A height of the head is adjusted so as to be smaller than a thickness of electrodes on the board. This adjustment is carried out by suitably determining the force exerted when pressing the semiconductor bare chip against the plate. Thereby, the thickness of the head of each stud bump can be determined as a whole with high accuracy.

It is yet another object of the present invention to provide a mounting structure of the semiconductor bare chip which can achieve an improved reliability in mounting the semiconductor bare chip on a board.

In order to achieve the above object, a mounting structure of a semiconductor bare chip is such that a semiconductor bare chip is mounted on a board with a plurality of stud bumps connected to electrodes on the board, the semiconductor bare chip including the plurality of stud bumps provided on a surface of the semiconductor bare chip body, each of the stud bumps including a seat and a head protruding from the seat, a height of the head being less than a thickness of electrodes provided on a board on which the semiconductor bare chip is mounted.

In the mounting structure described above, the semiconductor bare chip may be displaced from its predetermined position. Then, if the head is placed at an electrode, the head is connected to the electrode. Even if the head is displaced from the electrode and if an amount of displacement is small, the shoulder of the seat touches the electrode, so that the stud bump is connected to the electrode. Therefore, an allowable amount of displacement of the semiconductor bare chip from the predetermined position can be increased compared to the related art. Thereby, an improved reliability is achieved when mounting the semiconductor bare chip on the board.

Other objects and further feature of the present invention will be apparent from the following detailed description when read in conjunction with the accompanying drawings.

BRIEF DESCRIPTION OF THE DRAWINGS

FIG. 3 is an enlarged cross sectional view of a part of a semiconductor bare chip of an embodiment of the present invention.

DETAILED DESCRIPTION OF THE PREFERRED EMBODIMENTS

In the following, a principle and an embodiment of the present invention will be described with reference to the accompanying drawings.

Figure 1:
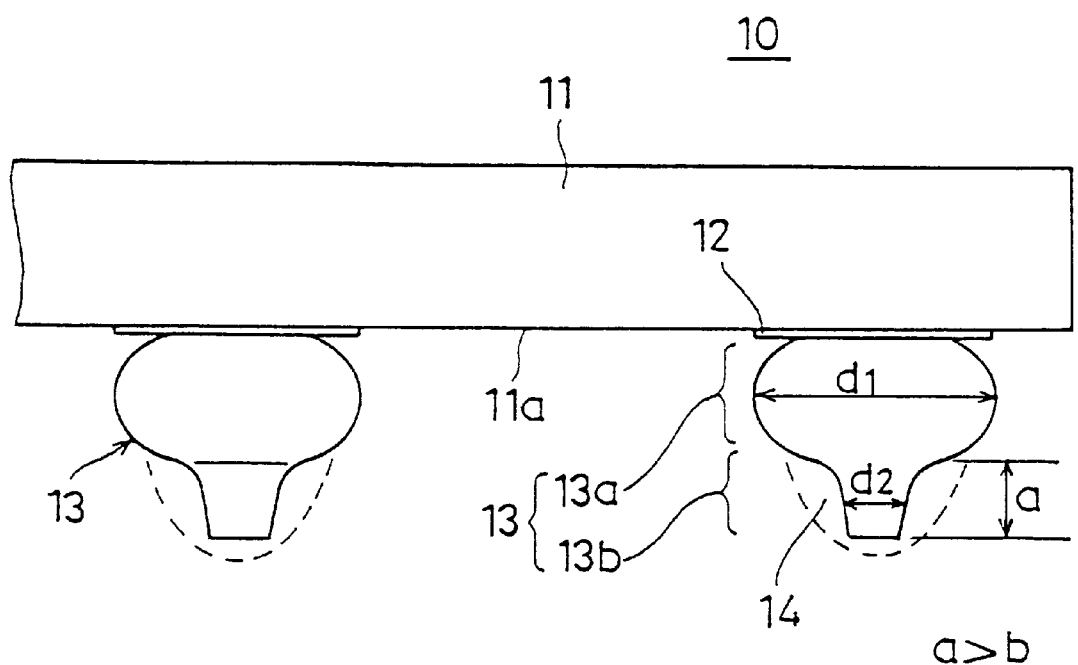
FIG. 1 is an enlarged cross sectional view of a part of a semiconductor bare chip of the prior art.
Figures 2A, 2B:
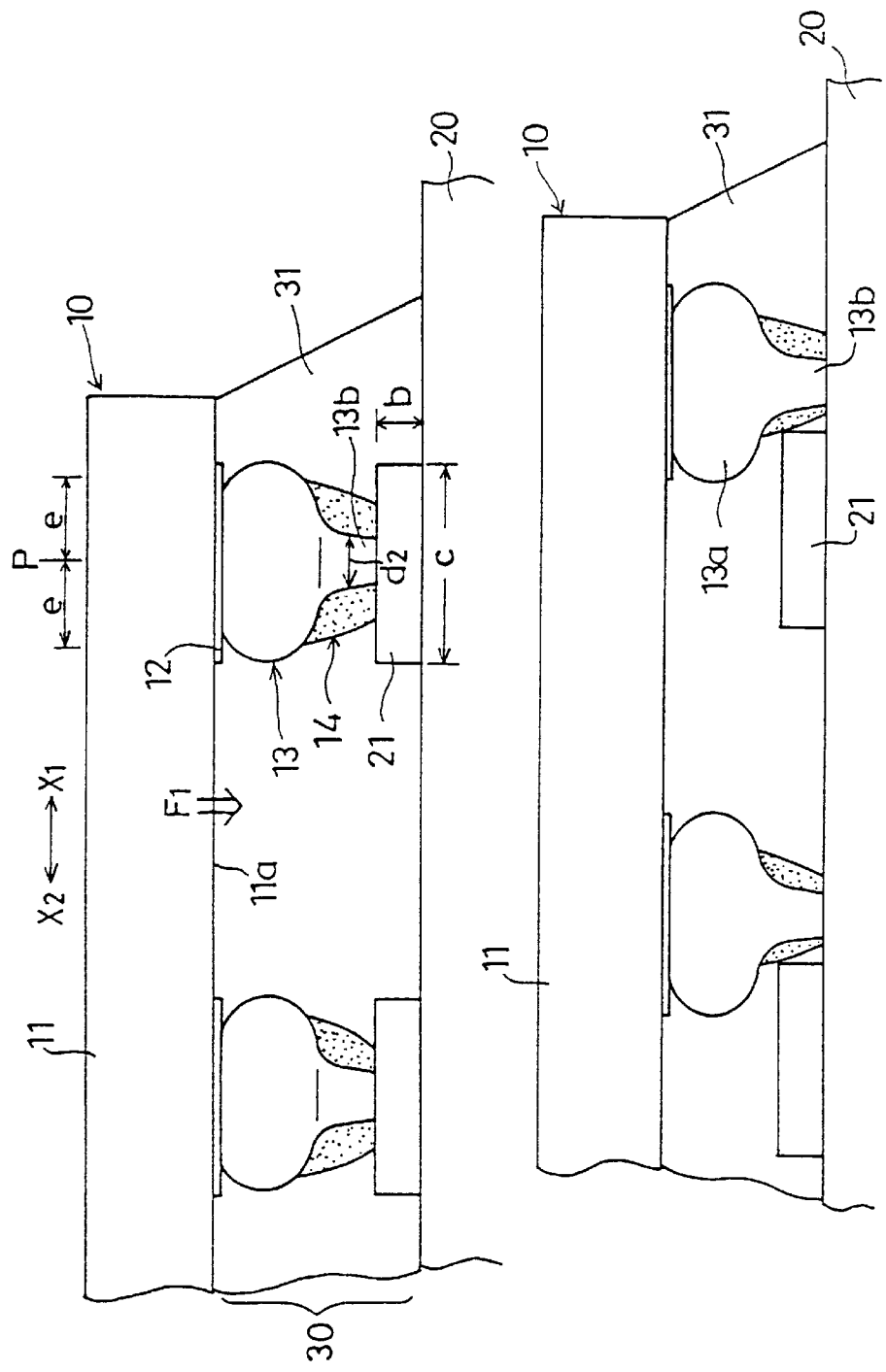
FIG. 2A is a diagram showing a semiconductor bare chip of the prior art at a predetermined position.
FIG. 2B is a diagram showing a semiconductor bare chip of the prior art at a displaced position.
Figures 4A, 4B:
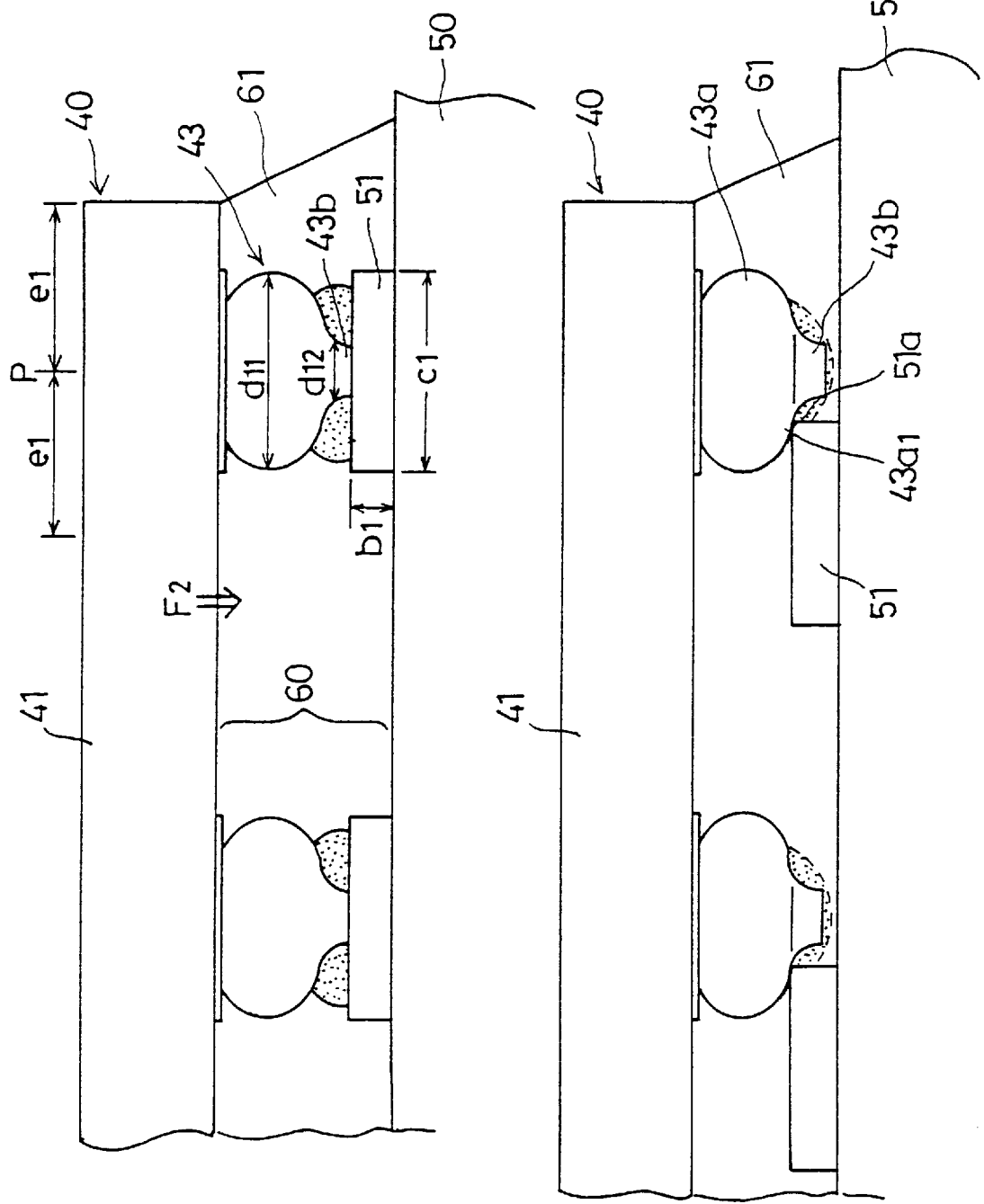
FIG. 4A is a diagram showing a semiconductor bare chip of the present invention at a predetermined position.
FIG. 4B is a diagram showing a semiconductor bare chip of the present invention at a displaced position.
Figure 5:
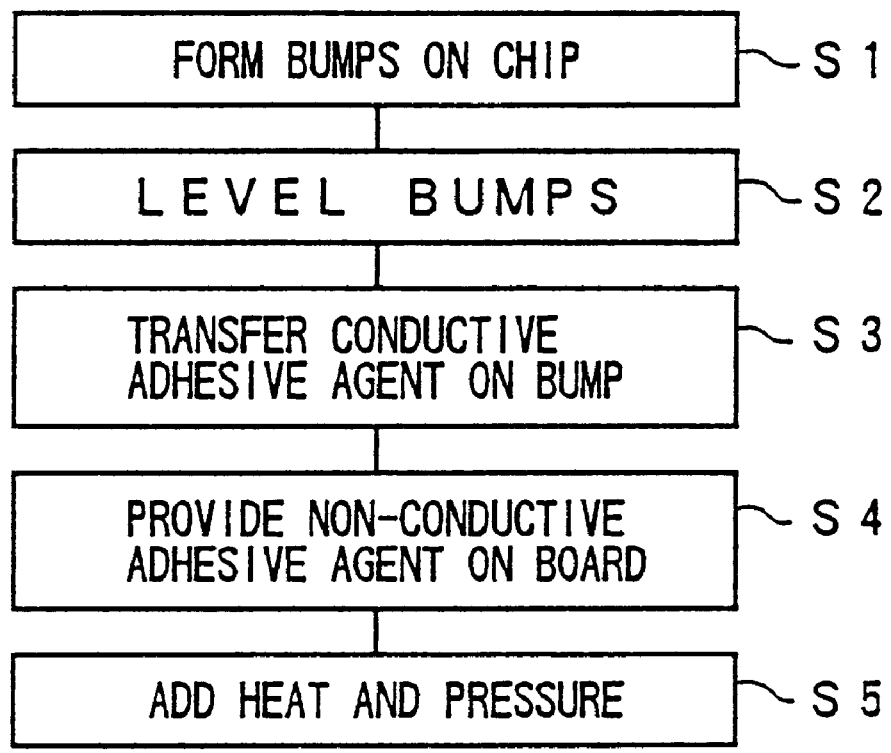
FIG. 5 is a flow diagram showing a manufacturing process and a mounting process of a semiconductor bare chip of the present invention.

FIG. 3 is an enlarged cross sectional view of a part of a semiconductor bare chip 40 of an embodiment of the present invention. FIGS. 4A–4B are diagrams showing the semiconductor bare chip 40 mounted on a printed board 50.

As shown in FIG. 3, the semiconductor bare chip 40 includes a semiconductor bare chip body 41, which is cut out from a wafer, electrodes 42 made of Al (aluminum), and stud bumps 43, made of Au. Each stud bump 43 is formed on each electrode 42 placed on a bottom surface 41a of the semiconductor bare chip body 41. Also, a conductive adhesive agent 44 is provided so as to cover a head of the stud bump 43. The conductive adhesive agent 44 is made of an epoxy resin including an Ag (silver) filler. The Ag filler has an average particle diameter of 0.6 $\mu$m, which is a tenth of the prior particle diameter. As will be described later, this is to allow a desired amount of the conductive adhesive agent 44 on a head 43b having a lower height that that of the related art. The stud bump 43 and the conductive adhesive agent 44 do not include lead.

The stud bump 43 is formed of a seat 43a and the head 43b. The seat 43a has a shape of a squeezed or compressed sphere with a diameter d11 of approximately 60 $\mu$m and a height f of 20–25 $\mu$m. The head 43b is substantially cylindrical. The head 43b has a diameter d12, which is smaller than the diameter d11 of the seat 43a. The head 43b protrudes from the seat 43a by a length a1. The length a1 is approximately 10 $\mu$m, which is as small as about ½ to ⅓ times the protrusion length a of the related art.

As shown in FIG. 4A, electrodes 51 are formed on the printed board 50. The electrodes 51 have a thickness b. The electrodes 51 have a rectangular shape with a side length c1 of approximately 40 $\mu$m. The stud bumps 43 and the electrodes 51 are positioned so as to correspond to each other. The thickness b1 of the electrodes 51 is approximately 20 $\mu$m.

The relationship between the height a1 of the head 43b and the thickness b1 of the electrode 51 can be expressed as a1<b1. Therefore an electrical connection of the electrodes 51 with the seats 43a is possible, as will be described later.

As shown in FIG. 4A the semiconductor bare chip 40 is mounted by a flip-chip method of the press joint type. That is, the head 43b of the stud bump 43 is pressed against the electrode 51 and is stuck on the electrode 51 using the conductive adhesive agent 44. Also, the semiconductor bare chip body 41 is stuck on the printed board 50 by a thermosetting adhesive agent 61 made of epoxy. Since the thermosetting adhesive agent 61 is provided within a gap 60 between the semiconductor bare chip body 41 and the printed board 50 and has been thermoset, the entire bottom surface 41a of the semiconductor bare chip body 41 is stuck on the printed board 50. Also, because the thermosetting adhesive agent 61 is thermoset and contracted, the entire bottom surface 41a of the semiconductor bare chip body 41 is pulled towards the printed board 50 with a force F2. With this force F2, the head 43b of the stud bump 43 is pressed against the electrode 51. Therefore, each stud bump is electrically connected to each electrode 51.

FIG. 4B shows a case where the semiconductor bare chip 40 is displaced from its predetermined position when mounted by the flip-chip method. The displacement is so large that the head 43b slips off from the electrode 51. Since the relationship between the height a1 of the head 43b and the thickness b1 of the electrode 51 can be expressed as a1<b1, the head does not touch the top surface of the printed board 50. Therefore a shoulder 43a1 of the seat 43a is pressed against the edge 51a of the electrode 51. Thus, each stud bump 43 is electrically connected with each electrode 51.

In the following, a size which allows the semiconductor bare chip 40 (here, the stud bump 43 is considered) to be displaced from a predetermined position P in either one of the directions X1 and X2 is referred to as an allowable size e1. When mounting the semiconductor bare chip 40 by the flip-chip method, the allowable size e1 is determined such the head 43b is displaced beyond the edge of the electrode 51 and the shoulder 43a1 of the seat 43a just touches the edge of the electrode 51. The allowable size e1 is generally (c1/2)+(d11/2), which is approximately 50 µm. Therefore, the allowable size e1 is approximately 20 µm larger than the allowable size e of the related art.

Therefore, a less accuracy in the positioning process is required when mounting the semiconductor bare chip 40 by the flip-chip method. This makes it easier to mount the semiconductor bare chip 40. Therefore, the possibility of poor mounting is reduced and increased yield of mounting processing is obtained.

Referring to FIG. 5, FIGS. 6A–6E and FIGS. 7A–7B, a method of manufacturing the semiconductor bare chip 40 (particularly a method of forming a stud bump) and a method of mounting the semiconductor bare chip 40 on the printed board 50 will be described.

Figure 6A:
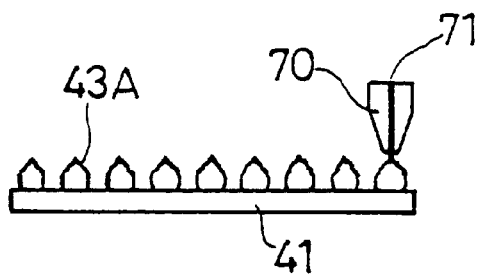
FIGS. 6A–6E are cross sectional diagrams showing a manufacturing process and a mounting process of a semiconductor bare chip of the present invention.
Figure 7A:
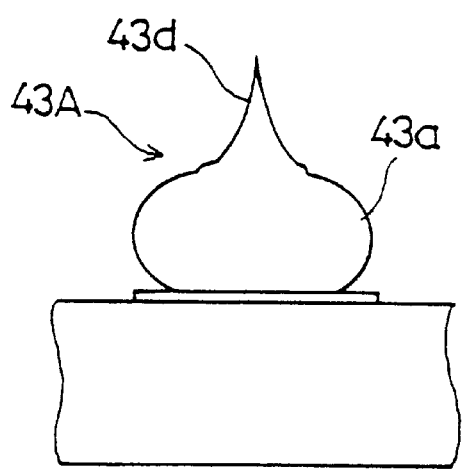
FIGS. 7A–7B are cross sectional diagrams showing a manufacturing process of a stud bump.

First, step S1 is performed. As shown in FIG. 6A, in a similar manner to wire bonding, an Au wire 71 of a predetermined length is projected from the tip of a capillary 70 of the bonder. The capillary 70 is brought in contact with the electrode 42 of the semiconductor bare chip body 41. Then, the Au wire 71 is bonded to the electrode by adding pressure and bar heating with ultra-sound. A wire clamp (not shown) clamps the Au wire sticking out of the rear end of the capillary 70. The capillary 70 is raised so that the Au wire 71 is pulled and cut at bonded parts. Thus, a stud bump 43A shown in FIG. 7A is formed. The stud bump 43A is formed from the seat 43a and a protrusion 43d having a pointed tip.

Figure 6B:
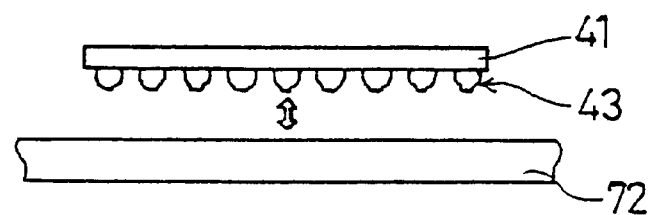
Figure 7B:
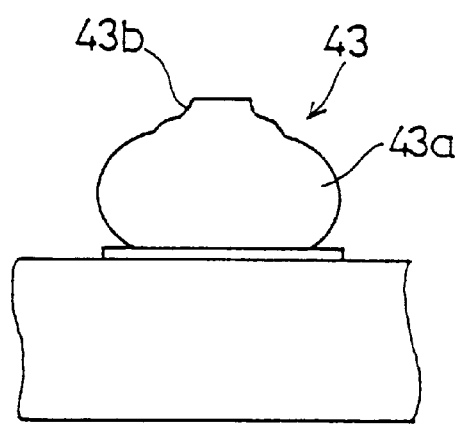

Secondly, step S2 is performed. As shown in FIG. 6B, a leveling process is performed. In this process, the pointed protrusion 43d is flattened by pressing the semiconductor bare chip body 41 against a glass plate 72. Thus, the head 43b shown in enlarged view of FIG. 7B is formed. Thereby the stud bump 43 is formed. The height of the head 43b is determined by a force exerted when the semiconductor bare chip 41 is pressed against the glass plate 72. Here, the force exerted is greater than that of the related art, and a head 43b has a height of approximately 10 µm.

Figure 6C:
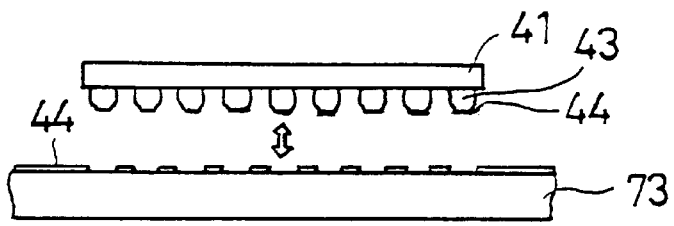

Thirdly, step S3 is performed. As shown in FIG. 6C, the semiconductor bare chip body 41 is pressed against a glass plate 73 on which the conductive adhesive agent 44 is provided with a thickness of approximately 10 µm. The semiconductor bare chip body 41 is then separated from the glass plate 73 so as to transfer the conductive adhesive agent 44 to the head 43b of the stud bump 43. Then the conductive adhesive agent 44 is precured so as to increase the adhesiveness. This is to ensure that the conductive adhesive agent 44 does not run off when mounting the semiconductor bare chip body 41. Thus, the semiconductor bare chip 40 is finished.

Figure 6D:
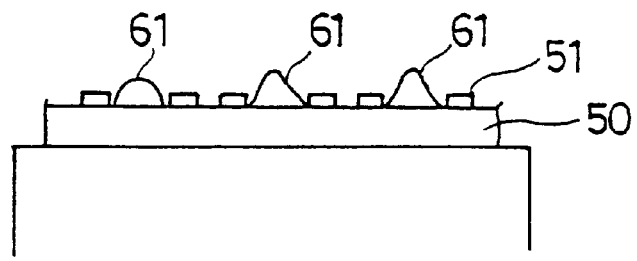

Fourthly, step S4 is performed. As shown in FIG. 6D, the thermosetting adhesive agent 61 is provided at each predetermined mounting area on the printed board 50.

Figure 6E:
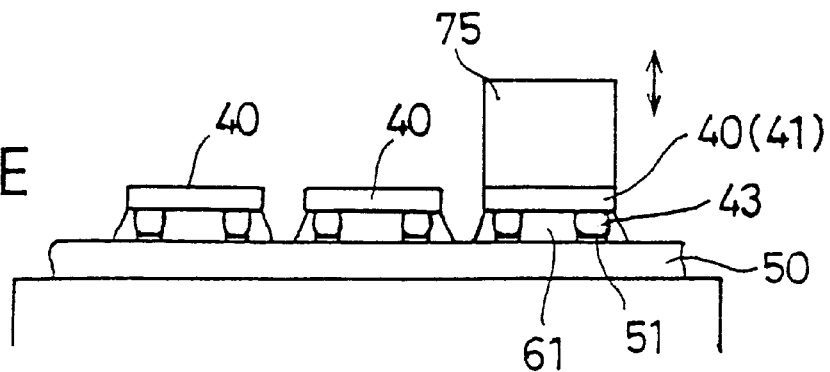

Finally, step S5 is performed. As shown in FIG. 6E, using a head 75 provided with a heater, the semiconductor bare chip 40 is mounted on the predetermined area on the printed board 50 and the thermosetting adhesive agent 61 is cured by adding pressure and heat. Thus, as shown in FIGS. 4A–B, the semiconductor bare chip 40 is mounted on the printed board 50.

Further, the present invention is not limited to these embodiments, but variations and modifications may be made without departing from the scope of the present invention.

What is claimed is:

1. A semiconductor bare chip comprising:
   a semiconductor bare chip body; and
   a plurality of stud bumps provided on a surface of said semiconductor bare chip body, each of said stud bumps including a seat and a head protruding from said seat, the seat and the head being made of the same material,
   wherein a height of said head is less than a thickness of electrodes provided on a printed board, said semiconductor bare chip being mounted on said printed board.

2. A mounting structure of a semiconductor bare chip wherein the semiconductor bare chip is mounted on a printed board with a plurality of stud bumps connected to electrodes on said printed board, said semiconductor bare chip comprising said plurality of stud bumps provided on a surface of the semiconductor bare chip body, each of said stud bumps comprising a seat and a head protruding from said seat, a height of said head being less than a thickness of electrodes on said printed board.

3. A device comprising:
   a printed board; and
   a semiconductor bare chip including:
      a semiconductor bare chip body; and
      a plurality of stud bumps provided on a surface of said semiconductor bare chip body, each of said stud bumps including a seat and a head protruding from said seat, wherein a height of said head is less than a thickness of electrodes provided on said printed board.

* * * * *